(12) United States Patent
Litwin et al.

(10) Patent No.: US 7,379,727 B2
(45) Date of Patent: May 27, 2008

(54) RF FRONT-END RECEIVER

(75) Inventors: Andrej Litwin, Danderyd (SE); Ganesh Kathiresan, London (GB)

(73) Assignee: Infineon Technologies AG (DE)

( * ) Notice: Subject to any disclaimer, the term of this patent is extended or adjusted under 35 U.S.C. 154(b) by 550 days.

(21) Appl. No.: 11/156,982

(22) Filed: Jun. 20, 2005

(65) Prior Publication Data

US 2006/0003727 A1 Jan. 5, 2006

Related U.S. Application Data

(63) Continuation of application No. PCT/SE03/01979, filed on Dec. 17, 2003.

(30) Foreign Application Priority Data

Dec. 12, 2002 (SE) .................................... 0203880

(51) Int. Cl.
*H04B 1/26* (2006.01)
(52) U.S. Cl. .................... 455/326; 455/323; 455/333; 455/313; 455/189.1; 455/324
(58) Field of Classification Search ................ 455/326, 455/333, 313, 323, 189.1, 324
See application file for complete search history.

(56) References Cited

U.S. PATENT DOCUMENTS 6,466,775 B1* 10/2002 Franca-Neto ................ 455/326
6,531,920 B1* 3/2003 Ishihara ....................... 330/254
6,952,572 B2* 10/2005 Wong et al. .................. 455/318
7,177,620 B1* 2/2007 Tsai et al. ..................... 455/333
2003/0114129 A1* 6/2003 Jerng ............................ 455/323
2005/0266822 A1* 12/2005 Shima et al. ................. 455/323

FOREIGN PATENT DOCUMENTS

EP 0 853 376 A1 7/1998
WO WO 002323 A1 1/2000

OTHER PUBLICATIONS

International Preliminary Report on Patentability for PCT/SE2003/001979; 3 pgs.

* cited by examiner

*Primary Examiner*—Nay Maung
*Assistant Examiner*—Richard Chan
(74) *Attorney, Agent, or Firm*—Coats & Bennett, P.L.L.C.

(57) ABSTRACT

An RF front-end receiver comprises a low noise amplifier and a local oscillator driver, which are connected to respective input ports of a mixer which comprises a first and second transistor with gates coupled to one output terminal, a third and fourth transistor with gates coupled to the other output terminal, a fifth and sixth transistor with gates coupled to respective output terminal of the local oscillator driver, the sources of the first and third transistors coupled to the drain of the fifth transistor, the sources of the second and fourth transistor coupled to the drain of the sixth transistor, the sources of the fifth and sixth transistor coupled to ground, the drains of the first and fourth transistor coupled to one output terminal of a mixer output port, and the drains of the second and third transistor coupled to the other output terminal of the mixer output port.

12 Claims, 1 Drawing Sheet

RF FRONT-END RECEIVER

CROSS REFERENCE TO RELATED APPLICATION

This application is a continuation of copending International Application No. PCT/SE03/01979 filed Dec. 17, 2003 which designates the United States, and claims priority to Swedish application no. 0203880-0 filed Dec. 20, 2002.

TECHNICAL FIELD

The invention relates generally to RF front-end receivers and more particularly to reducing supply voltage requirements of such receivers.

BACKGROUND

As current processes and technologies used in connection with the production of semiconductor circuits scale further into deep submicron levels, the reduction in gate oxide thickness requires that the voltages around a circuit have to be reduced as well. Hence, in recent years, designing important analog building blocks for lower voltage performance has become a primary concern. Furthermore, careful design of these analog building blocks in a lower voltage environment leads to reduced power consumption, which is extremely important in hand-held and mobile devices. Designing with a lower supply voltage for RF building blocks is all the more important, since the RF front-end of mobile devices has always been the culprit in terms of supply voltage and power consumption.

FIG. 1 on the appended drawing illustrates an embodiment of a known RF front-end receiver.

In a manner known per se, the RF front-end receiver in FIG. 1 comprises a low noise amplifier LNA and a local oscillator driver LOD, which are connected to respective input ports of a mixer.

The low noise amplifier LNA receives an RF signal RF and supplies it to one mixer input port and the local oscillator driver LOD receives a local oscillator signal LO and supplies it to the other mixer input port. From the RF signal RF and the local oscillator signal LO, the mixer generates an intermediate frequency signal on its output terminals IF+, IF−.

The mixer is a variant of a standard Gilbert cell mixer and comprises a transconductance stage and a switching stage. By means of mixers of the type shown in FIG. 1, it is possible to use lower supply voltages.

The transconductance stage comprises two transistors M1 and M2. The gates of the transistors M1 and M2 form the mixer input port for the RF signal RF and are coupled to respective output terminals RF+, RF− of the low noise amplifier LNA. The sources of the transistors M1 and M2 are interconnected to ground, and the drains of the transistors M1 and M2 are coupled to respective interconnected sources of switching transistors M3, M4 and M5, M6, respectively, of the mixer switching stage.

In the switching stage of the mixer in FIG. 1, the gates of the transistors M3, M6 and M4, M5, respectively, are interconnected and form the mixer input port for the local oscillator signal, that is coupled to the output terminals of the local oscillator driver LOD.

The drains of the transistors M3, M5 and M4, M6, respectively, are interconnected and form the mixer output port IF+, IF− for the intermediate frequency signal.

The mixer in FIG. 1 will operate in a balanced manner as long as the input RF signal from the low noise amplifier LNA is differential. Since the mixer is not fully differential, it will not provide any common mode rejection. Common mode feedback can be employed at the IF output port, but nonetheless the mixer will have a lower common mode rejection ratio than a standard Gilbert cell mixer. In order to maintain reasonable common mode rejection in the RF front-end, it is important that the LNA that precedes this mixer is fully differential.

SUMMARY

The object of the invention is to bring about an RF front-end receiver that can operate at low supply voltages and at the same time provide common mode rejection.

This is generally attained by modifying the way the RF and LO input signals are fed into the mixer.

More specifically, in an RF front-end receiver that comprises a low noise amplifier and a local oscillator driver, which are connected to respective input ports of a mixer that comprises a first and a second transistor having their gates coupled to one input terminal of a first input port of the mixer, a third and a fourth transistor having their gates coupled to the other input terminal of the first input port of the mixer, and a fifth and a sixth transistor having their gates coupled to respective input terminal of a second input port of the mixer, where the sources of the first and third transistors are coupled to the drain of the fifth transistor, the sources of the second and fourth transistor are coupled to the drain of the sixth transistor, the sources of the fifth and sixth transistor are coupled to ground, the drains of the first and fourth transistor are coupled to one output terminal of a mixer output port, and the drains of the second and third transistor are coupled to the other output terminal of the mixer output port, this is attained in that the low noise amplifier is connected with its output terminals to the first input port of the mixer, and the local oscillator driver is connected with its output terminals to the second input port of the mixer.

Thus, the RF input signal is fed to transistors above the transistors to which the LO input signal is fed. Basically, with respect to the RF input signal, the mixer consists of two differential pairs, which are cross-coupled at the output. The advantage of this arrangement of the inputs, where the RF input signal is fed to transistors above the LO input signal, is that although the mixer has only two stacks of transistors, it is still fully differential. Therefore, the mixer can operate at supply voltages similar to the mixer described above with the added bonus of common mode rejection.

BRIEF DESCRIPTION OF THE DRAWINGS

The invention will be described more in detail below with reference to the appended drawing on which FIG. 1, described above, illustrates an embodiment of a known RF front-end receiver.

DESCRIPTION OF THE INVENTION

Figure 2:
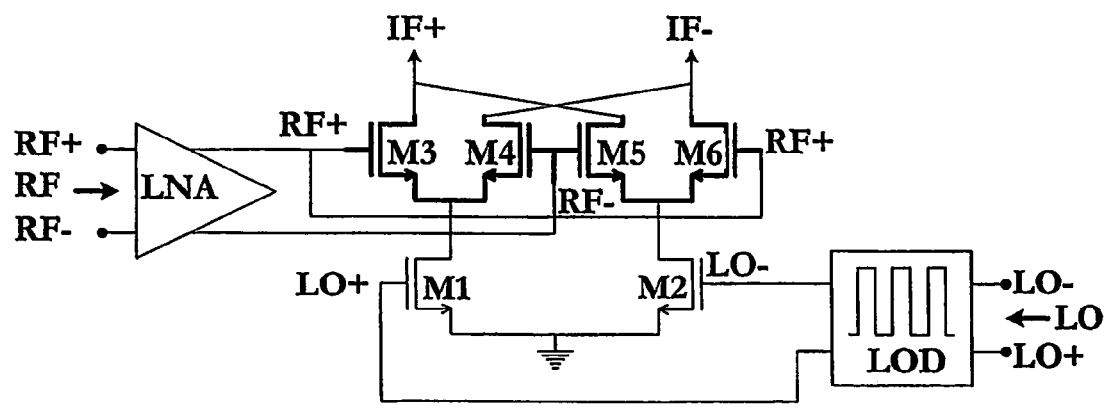
FIG. 2 illustrates an embodiment of an RF front-end receiver according to the invention.

FIG. 2 illustrates an RF front-end receiver according to the invention.

Figure 1:
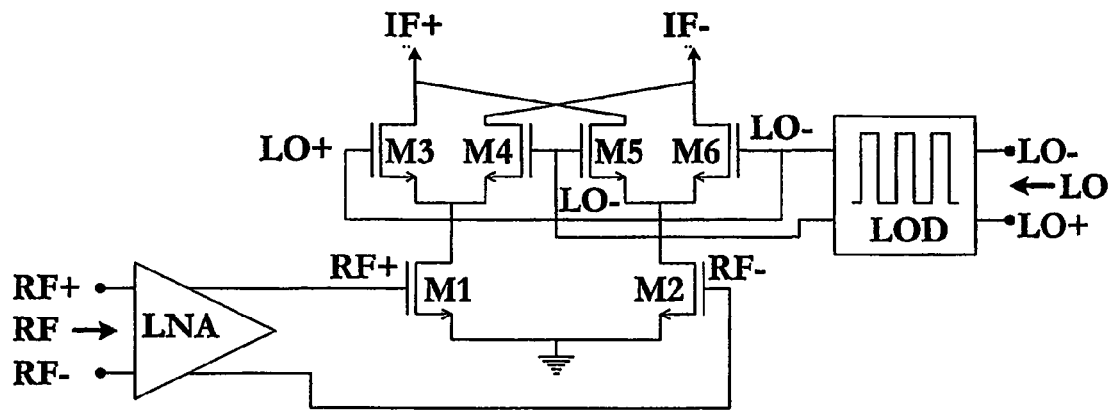

Elements in FIG. 2, which are identical to elements in FIG. 1 have been provided with the same reference characters.

In accordance with the invention, the switching stage in the embodiment in FIG. 1 is made the transconductance stage in FIG. 2 and the transconductance stage in the embodiment in FIG. 1 is made the switching stage in FIG. 2.

Thus, in FIG. 2, the low noise amplifier LNA is connected with its output terminals to the interconnected gates of the transistors M3, M6 and M4, M5, respectively, that form a mixer input port RF+, RF− for the RF signal.

Moreover, in FIG. 2, the local oscillator driver LOD is coupled with its output terminals to the gates of the transistors M1 and M2 that form a mixer input port LO+, LO− for the local oscillator signal.

As mentioned above, with respect to the RF input signal, the two stack mixer in FIG. 2 is basically two differential pairs, which are cross coupled at the output. Each of these differential pairs is turned ON and OFF in sequence, controlled by the large input signal from the local oscillator LO.

In the LO+ phase, the LO+ input is high while the LO− input is low. As a result transistor M2 is OFF, which in turn switches off the differential pair formed by transistors M5 and M6, while the differential pair formed by transistors M1, M3 and M4 is switched ON. Although transistor M1 is switched ON by the high LO+ signal at its gate, the circuit is designed so that transistor M1 is held in saturation and not allowed to go into the triode region. Therefore, transistor M1 can form the tail current source of a differential pair. The differential RF input signal can now give rise to a differential IF output via the gain of the differential pair of M1, M3 and M4.

In the LO− phase, transistor M1 is switched OFF while transistor M2 turns ON. Now, the differential pair is formed by transistors M2, M5 and M6. For this differential pair, the RF input signal is connected with the opposite polarity compared to the previous differential pair in the LO+ phase. Therefore, the polarity of the IF output will also be reversed, although the gain of the system still remains the same since both differential pairs are identical.

For the mixer in FIG. 2 to operate as described above, it is important that transistor M1 be held in saturation while ON. Moreover, the quality of the differential pair strongly influences the gain of the system and the amount of common mode rejection that the system will provide. This represents an important trade-off in the design of transistors M1 and M2. On the one hand, they should be sized with small channel lengths for fast switching and high frequency operation. On the other hand, they are also required to provide a reasonable output resistance (drain-source resistance) when ON in order to form a high quality differential pair.

With careful design of the mixer core, it is possible to obtain reasonable switching times as well as performance and common mode rejection from the differential pair.

The common mode rejection will definitely be better than in the known embodiment shown in FIG. 1. This represents an overall trade-off between supply voltage and common mode rejection.

Another important system level consideration when using this mixer is that the whole differential pair is switching ON and OFF at the RF input. This means that the input impedance of the mixer can change periodically during operation. This condition is eased a bit since while one differential pair is switching ON, another is switching OFF and careful design and layout can ensure that there is reasonable cancellation of the switching effects at the RF input.

Using low threshold transistors (with threshold voltages of about 0V) for transistors M3-M6 will help reduce the required gate-source voltages of these devices. This is because the required gate-source voltage will be approximately the required gate-source overdrive voltage if the threshold voltage is roughly 0V. Therefore, using low threshold transistors for M3-M6 can help further reduce the supply voltage requirements of the whole receiver by reducing the supply voltage requirements of the LNA coupled to the mixer.

Many newer technologies do offer transistors with various threshold voltages and oxide thicknesses. However, low threshold transistors are not available in all technologies. Nonetheless, low threshold transistors can be obtained in any CMOS technology by simply masking out the threshold channel implant, thus providing a native MOS transistor with a threshold voltage of around 0V (for an NMOS device). The two stack mixer according to the invention has been implemented in a technology where low threshold devices were not explicitly available. Instead, they were obtained by masking out the threshold implant.

Reducing the threshold voltage of a MOS device can have important implications for the leakage drain current through the device. However, leakage currents will not be a problem with the mixer circuit according to the invention. Although the devices are being switched ON and OFF and hence might have a higher leakage current in the OFF state, the overall output IF current is orders of magnitude higher than the leakage currents. Hence, any leakage current will not noticeably affect the output.

Furthermore the transistors M1 and M2 coupled to the local oscillator driver LOD are not low threshold devices, and hence they will help limit the overall leakage current that flows down the ground.

As stated above, the mixer can operate at supply voltages similar to the mixer described in connection with FIG. 1 with the added bonus of common mode rejection.

We claim:

1. An RF front-end receiver comprising a low noise amplifier and a local oscillator driver, which are connected to respective input ports of a mixer, the mixer comprising:
    a first and a second transistor having their gates coupled to one input terminal of a first input port of the mixer,
    a third and a fourth transistor having their gates coupled to the other input terminal of the first input port of the mixer,
    a fifth and a sixth transistor having their gates coupled to respective input terminal of a second input port of the mixer,
    the sources of the first and third transistors being coupled to the drain of the fifth transistor,
    the sources of the second and fourth transistor being coupled to the drain of the sixth transistor,
    the sources of the fifth and sixth transistor being coupled to ground,
    the drains of the first and fourth transistor being coupled to one output terminal of a mixer output port, and
    the drains of the second and third transistor being coupled to the other output terminal of the mixer output port,
    wherein
    the low noise amplifier is connected with its output terminals to the first input port of the mixer, and
    the local oscillator driver is connected with its output terminals to the second input port of the mixer.

2. The RF front-end receiver according to claim 1, wherein the first and the second transistor having their gates coupled to one input terminal of the first input port of the mixer, and the third and the fourth transistor having their gates coupled to the other input terminal of the first input port have a low threshold voltage.

3. An RF front-end receiver comprising:
a mixer comprising:
- a first and a second transistor having their gates coupled to one input terminal of a first input port of the mixer,
- a third and a fourth transistor having their gates coupled to the other input terminal of the first input port of the mixer,
- a fifth and a sixth transistor having their gates coupled to respective input terminal of a second input port of the mixer,
- the sources of the first and third transistors being coupled to the drain of the fifth transistor,
- the sources of the second and fourth transistor being coupled to the drain of the sixth transistor,
- the sources of the fifth and sixth transistor being coupled to ground,
- the drains of the first and fourth transistor being coupled to one output terminal of a mixer output port, and
- the drains of the second and third transistor being coupled to the other output terminal of the mixer output port,
- a low noise amplifier coupled with its output terminals to the first input port of the mixer, and
- a local oscillator driver coupled with its output terminals to the second input port of the mixer.

4. The RF front-end receiver according to claim 3, wherein the first and the second transistor having their gates coupled to one input terminal of the first input port of the mixer, and the third and the fourth transistor having their gates coupled to the other input terminal of the first input port have a low threshold voltage.

5. The RF front-end receiver according to claim 4, wherein the low threshold voltage transistors can be obtained in a CMOS technology by masking out a threshold channel implant.

6. The RF front-end receiver according to claim 3, wherein the first and the second transistor can be obtained in a CMOS technology by masking out a threshold channel implant.

7. The RF front-end receiver according to claim 3, wherein the third and the fourth transistor can be obtained in a CMOS technology by masking out a threshold channel implant.

8. An method of manufacturing an RF front-end receiver comprising the steps of:
providing within a mixer:
- a first and a second transistor having their gates coupled to one input terminal of a first input port of the mixer,
- a third and a fourth transistor having their gates coupled to the other input terminal of the first input port of the mixer,
- a fifth and a sixth transistor having their gates coupled to respective input terminal of a second input port of the mixer,
- the sources of the first and third transistors being coupled to the drain of the fifth transistor,
- the sources of the second and fourth transistor being coupled to the drain of the sixth transistor,
- the sources of the fifth and sixth transistor being coupled to ground,
- the drains of the first and fourth transistor being coupled to one output terminal of a mixer output port, and
- the drains of the second and third transistor being coupled to the other output terminal of the mixer output port, providing a low noise amplifier and coupling it with its output terminals to the first input port of the mixer, and
providing a local oscillator driver and coupling it with its output terminals to the second input port of the mixer.

9. The method according to claim 8, further comprising the step of providing the first and the second transistor and the third and the fourth transistor as low threshold voltage transistors.

10. The method according to claim 9, wherein the low threshold voltage transistors can be obtained in a CMOS technology by masking out a threshold channel implant.

11. The method according to claim 8, wherein the first and the second transistor can be obtained in a CMOS technology by masking out a threshold channel implant.

12. The method according to claim 8, wherein the third and the fourth transistor can be obtained in a CMOS technology by masking out a threshold channel implant.

* * * * *

UNITED STATES PATENT AND TRADEMARK OFFICE
CERTIFICATE OF CORRECTION

PATENT NO. : 7,379,727 B2  Page 1 of 1
APPLICATION NO. : 11/156982
DATED : May 27, 2008
INVENTOR(S) : Litwin et al.

It is certified that error appears in the above-identified patent and that said Letters Patent is hereby corrected as shown below:

Title Page; item (30);
On the cover sheet of the patent, the Foreign Application Priority date "Dec. 12, 2002" should read --Dec. 20, 2002--.

Signed and Sealed this

Fourteenth Day of October, 2008

JON W. DUDAS
*Director of the United States Patent and Trademark Office*